United States Patent
Iwai et al.

(12)

(10) Patent No.: US 6,759,176 B2
(45) Date of Patent: Jul. 6, 2004

(54) POSITIVE-WORKING RESIST COMPOSITION

(75) Inventors: Takeshi Iwai, Sagamihara (JP); Hideo Hada, Hiratsuka (JP); Satoshi Fujimura, Chigasaki (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/993,627

(22) Filed: Nov. 27, 2001

(65) Prior Publication Data

US 2002/0102492 A1 Aug. 1, 2002

(30) Foreign Application Priority Data

Nov. 27, 2000 (JP) ........................................ 2000-360110

(51) Int. Cl.[7] .............................................. G03F 7/039
(52) U.S. Cl. .................................... 430/270.1; 430/905
(58) Field of Search ............................... 430/270.1, 905

(56) References Cited

U.S. PATENT DOCUMENTS

| | | | | |
|---|---|---|---|---|
| 6,004,720 A | | 12/1999 | Takechi et al. | 430/270.1 |
| 6,013,416 A | | 1/2000 | Nozaki et al. | 430/270.1 |
| 6,280,898 B1 | * | 8/2001 | Hasegawa et al. | 430/270.1 |
| 6,448,420 B1 | * | 9/2002 | Kinsho et al. | 552/549 |
| 2001/0026901 A1 | * | 10/2001 | Maeda et al. | 430/270.1 |
| 2002/0042018 A1 | * | 4/2002 | Maeda et al. | 430/270.1 |

FOREIGN PATENT DOCUMENTS

| | | |
|---|---|---|
| JP | 4-39665 | 2/1992 |
| JP | 5-346668 | 12/1993 |
| JP | 10-319595 | 12/1998 |
| JP | 11-12326 | 1/1999 |
| JP | 2000-26446 | 1/2000 |
| JP | 2000-147769 | 5/2000 |
| WO | 00/01684 | 1/2000 |

* cited by examiner

*Primary Examiner*—John S. Chu
(74) *Attorney, Agent, or Firm*—Wenderoth, Lind & Ponack, LLP

(57) ABSTRACT

Provided is a chemical-amplification positive-working resist composition capable of giving a resist pattern having excellent dry etching resistance and adhesion to the substrate with high pattern resolution and further having a good profile with improvement in the line edge roughness. It is a chemical-amplification positive-working resist composition by using, as the component (A) in a positive-working resist composition comprising (A) a resinous ingredient capable of being imparted with increased solubility in an alkaline aqueous solution by the interaction of an acid, (B) an acid-generating agent ingredient generating an acid by irradiation with a radiation and (C) an organic solvent, a copolymer of which the monomer units constituting the main chain consist of acrylic acid ester or methacrylic acid ester units having solubility-reducing groups, monomer units derived from an ester of acrylic acid or methacrylic acid and a lactone ring-containing bridged saturated polycyclic alcohol and monomer units derived from an ester of acrylic acid or methacrylic acid and a straight-chain alcohol substituted by hydroxyl group, alkoxy group or acyl group.

10 Claims, No Drawings

POSITIVE-WORKING RESIST COMPOSITION

BACKGROUND OF THE INVENTION

The present invention relates to a positive-working resist composition or, more particularly, to a chemical-amplification positive-working resist composition capable of forming a resist pattern having high transparency to active light of 200 nm wavelength or shorter or, in particular, to ArF excimer laser beams, high pattern resolution and excellent cross sectional profile, etching resistance of the resist pattern and adhesion to the substrate and further improved in the line edge roughness.

As the base resinous ingredient in a chemical-amplification resist, those used heretofore include polyhydroxystyrenes having high transparency to the KrF excimer laser beams (248 nm) and those by substitution of acid-dissociable solubility-reducing groups for the hydroxyl groups thereof.

However, semiconductor devices are now on the way toward higher and higher fineness and development works are actively undertaken for a process by using ArF excimer laser beams (193 nm).

In the process using ArF excimer laser beams (193 nm), resins having benzene nuclei such as polyhydroxystyrenes have a defect of insufficient transparency to these beams. In order to overcome this defect, many proposals are made heretofore for resins having the main-chain units derived from an acrylic acid ester or methacrylic acid ester having an adamantyl skeleton in the ester portion (referred to simply as an "acrylic acid ester resin" hereinafter) having no benzene nuclei and having excellent dry etching resistance (Japanese Patent No. 2881969, Patent Kokai No. 5-346668, Patent Kokai No. 7-234511, Patent Kokai No. 9-73173, Patent Kokai No. 9-90637, Patent Kokai No. 10-161313, Patent Kokai No. 10-319595, Patent Kokai No. 11-12326 and elsewhere).

A positive-working resist composition by using these acrylic acid ester resins is developable with a standard developer solution which is a 2.38% by mass aqueous solution of tetramethylammonium hydroxide and the results obtained are satisfactory to some extent in respects of the transparency to ArF excimer laser beams, dry etching resistance and adhesion to the substrate.

In the field of semiconductor devices nowadays, however, an ultrafine pattern further has become required necessitating pattern resolution at 150 nm or finer or in the vicinity of 100 nm while the above-mentioned effectiveness is no longer sufficient for such a requirement.

In order to obtain a resist pattern of such high pattern resolution in a good profile, it is necessary to decrease the resist film thickness (prior art film thickness: about 500 nm and now desired film thickness: 300-400 nm) and to increase the fraction of the acrylic ester units having acid-dissociable solubility-reducing groups (e.g., 2-methyladamantyl methacrylate units) in the base resin.

However, a decrease in the film thickness is accompanied by a relative increase in the film thickness reduction during dry etching as compared with that of a conventional film thickness so that it is necessary to further improve the dry etching resistance and an increase in the fraction of the acrylic ester units having acid-dissociable solubility-reducing groups is accompanied by an increase in the hydrophobicity resulting in a problem of degradation in the adhesion to the substrate. A difficulty is also encountered in the formation of a resist pattern with a good profile, as the size of a resist pattern is so fine.

Accordingly, along with the improvement in the pattern resolution, it has become required to obtain a good resist pattern profile together with improvements in the dry etching resistance and adhesion to the substrate. In order to satisfy these requirements, a proposal is made for a chemical-amplification resist composition containing a copolymer consisting of (meth)acrylic acid units having lactone ring-containing bridged saturated polycyclic hydrocarbon groups, (meth)acrylic acid units having bridged polycyclic hydrocarbon groups having acid-decomposable groups or carboxyl groups and (meth)acrylic acid or alkyl (meth)acrylate units and having a mass-average molecular weight of 2000 to 200000 (Japanese Patent Kokai No. 2000-26446).

Recently, an important problem came under attention, as for the ArF resists, besides the aforementioned requirements, for that, of which the target semiconductor design rule was still finer, to prevent drawbacks due to line edge roughness (LER) which is a phenomenon that non-uniform raggedness is formed along the outer peripheries of lines to decrease accuracy and fine surface roughening during etching but no solution has been obtained yet in this regard.

SUMMARY OF THE INVENTION

The present invention has been completed with an object to provide a chemical-amplification positive-working resist composition capable of giving a resist pattern of high pattern resolution having excellent dry etching resistance and adhesion to the substrate as well as a good profile with improved line edge roughness.

The inventors have continued extensive investigations on a chemical-amplification resist for ArF use and, as a result, have arrived at a discovery that great improvements can be accomplished in the dry etching resistance and adhesion to the substrate as well as line edge roughness by using, as the resinous ingredient capable of being imparted with increased solubility in alkali by the interaction with an acid to be used in combination with an acid-generating agent, a copolymer containing acrylic acid or methacrylic acid ester units having lactone ring-containing bridged saturated polycyclic hydrocarbon groups and acrylic acid or methacrylic acid ester units having straight-chain alkyl groups substituted by hydroxyl groups, alkoxy groups or acyl groups.

Namely, the present invention provides a chemical-amplification positive-working resist composition characterized by the use of, in a positive-working resist composition containing (A) a resinous ingredient capable of being imparted with increased solubility in alkali by interacting with an acid, (B) an acid-generating agent capable of generating an acid by irradiation with a radiation and (C) an organic solvent, as the component (A), a copolymer of which the monomer units constituting the main chain consist of (a1) acrylic acid ester or methacrylic acid ester units having solubility-reducing groups, (a2) the monomer units derived from an ester between acrylic acid or methacrylic acid and a lactone ring-containing bridged saturated polycyclic alcohol and (a3) the monomer units derived from an ester between acrylic acid or methacrylic acid and a straight-chain alcohol substituted by a hydroxyl group, alkoxy group or acyl group.

DETAILED DESCRIPTION OF THE PREFERRED EMBODIMENTS

In the composition of the present invention, the resinous ingredient (A) is necessarily a resin capable of being imparted with increased solubility in alkali by the interaction with an acid. Such a resin is exemplified, for example, by a polymer or copolymer having, in the main chain, the monomer units derived from an acrylic acid ester or methacrylic acid ester having a solubility-reducing group, of which the ester group is dissociated by an acid.

The polymer or copolymer here having the monomer units derived from an acrylic acid ester or methacrylic acid ester in the main chain is a polymer or copolymer having a main chain consisting of the monomer units represented by the general formula:

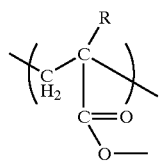

(I)

(R in the formula is a hydrogen atom or a methyl group).

It is essential that the same has a property that the solubility in alkali is increased by the acid generated when the acid-generating agent (B) used in combination receives interaction of a radiation and such a property is imparted by protecting the hydroxyl group of the carboxyl group of the monomer unit derived from acrylic acid or methacrylic acid with an acid-dissociable solubility-reducing group to give alkali-insolubility. As a result of conversion of the polymer or copolymer having such monomer units rendered alkali-soluble when the solubility-reducing groups are eliminated by the interaction of the acid generated from the acid-generating agent (B), the resist layer in the light-exposed areas is rendered alkali-soluble while the unexposed areas remain alkali-insoluble leading to the formation of a positive-working resist pattern.

The solubility-reducing group used here can be any one adequately selected from the solubility-reducing groups known heretofore in the chemical-amplification positive-working resists.

Such a solubility-reducing group is exemplified, for example, by tertiary alkyl groups, cyclic ether groups such as tetrahydropyranyl group and tetrahydrofuranyl group, alkoxyalkyl groups such as 1-ethoxyethyl group and 1-methoxypropyl group, lactone residues such as a group by eliminating a hydrogen atom on the α-carbon atom or β-carbon atom of γ-butyrolactone, and others, of which tertiary alkyl groups are particularly preferable.

The tertiary alkyl group is exemplified by branched alkyl groups such as tert-butyl group, tert-amyl group and the like, a group by eliminating a hydrogen atom from the hydroxyl group of 2-hydroxy-3-pinanone and cyclic tertiary alkyl groups such as 2-methyladamantyl group, 2-ethyladamantyl group, 2-(1-adamantyl)-2-propyl group, 1-methylcyclohexyl group, 1-ethylcyclohexyl group and the like. Two kinds or more of different solubility-reducing groups among them can be contained in the component (A).

While this cyclic tertiary alkyl group has a monocyclic or polycyclic saturated hydrocarbon group as the hydrocarbon group bonded to the ester portion of the acrylic acid ester, 2-(lower alkyl) adamantly groups such as 2-methyladamantyl group and 2-ethyladamantyl group are preferable among them in respect of excellent dry etching resistance and high pattern resolution of the resist pattern obtained therewith.

The acrylic acid ester unit having a 2-(lower alkyl) adamantly group can be represented by the general formula:

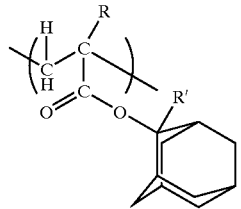

(II)

(R in the formula has the same meaning as aforementioned and R' is a lower alkyl group of 1 to 4 carbon atoms) and the examples of R' therein include methyl group, ethyl group, propyl group and butyl group of which methyl group is particularly preferable.

It is essential in the present invention that the resinous ingredient contains the monomer units derived from the acrylic acid ester or methacrylic acid ester having an ester portion having a lactone ring-containing bridged saturated polycyclic hydrocarbon group and the units derived from an acrylic acid ester or methacrylic acid ester having a straight-chain alkyl group substituted by a hydroxyl group, alkoxy group or acyl group.

Namely, as the resinous ingredient (A) in the positive-working resist composition of the present invention, a copolymer is used, which contains, for example, (a1) the monomer units represented by the general formula:

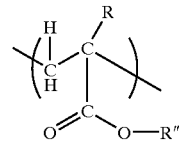

(III)

(R in the formula has the same meaning as aforementioned and R" is a solubility-reducing group), (a2) the monomer units represented by the general formula:

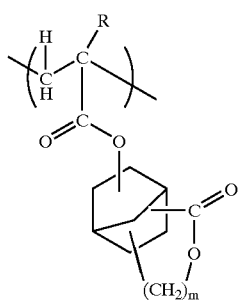

(IV)

(R in the formula has the same meaning as aforementioned and m is 0 or 1) and (a3) the monomer units represented by the general formula:

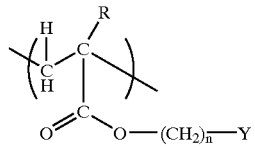

(V)

(R in the formula has the same meaning as aforementioned, Y is a hydroxyl group, alkoxy group or acyl group and n is an integer of 2 to 18).

As the monomer unit (a1) represented by the above given general formula (III), for example, the unit expressed by:

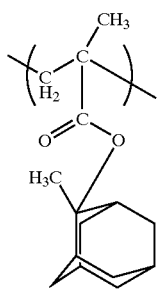

(VI)

is preferable.

As the monomer unit (a2) represented by the above given general formula (IV), for example, the unit expressed by the formula for m=0:

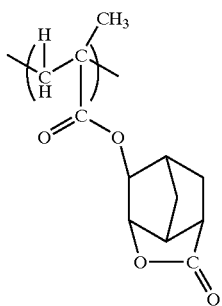

(VII)

or the formula for m=1:

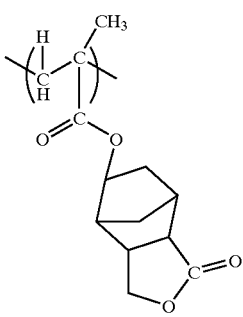

(VIII)

is preferable.

As the monomer unit (a3) represented by the above given general formula (V), it is preferable that n is 2 to 18 and the —$(CH_2)_n$— is a straight-chain alkylene group. It is presumable that the straightway chain-like form contributes to the improvement of LER (line edge roughness).

Particular examples of —$(CH_2)_n$—Y in such a monomer unit (a3) include hydroxyethyl group, hydroxypropyl group, 2-ethoxyethyl group, 2-ethoxyethyl group, 2-acetylethyl group and the like. Incidentally, the mass-average molecular weight of the resinous ingredient (A) in the present invention is in the range from 5000 to 20000 or, preferably, from 8000 to 15000.

It is preferable that the resinous ingredient (A) contains at least 10% by moles of the monomer units (a2). In the present invention, particularly satisfactory in respect of the resist pattern having high pattern resolution with excellent dry etching resistance and adhesion to the substrate as well as improved line edge roughness is a copolymer consisting of 40–80% by moles or, preferably, 50–75% by moles of the monomer units (a1) represented by the general formula (II), 10–40% by moles or, preferably, 20–35% by moles of the monomer units (a2) represented by the general formula (IV) and 5–20% by moles or, preferably, 7–15% by moles of the monomer units (a3) represented by the general formula (V).

When the total of the monomer units represented by the general formulas (II) and (IV) is 50% by moles or larger or, preferably, in the range from 80 to 90% by moles, an advantage is also obtained that the resist film formed has decreased surface roughening.

In the composition of the present invention, it is optional that, as this resinous ingredient (A), the monomers forming the aforementioned respective monomer units can be copolymerized for use adequately in combination, according to need, with an acrylic acid derivative or methacrylic acid derivative having a dry etching resistance improving group or non-acid-dissociable solubility-reducing group heretofore known in chemical-amplification positive-working resists, carboxylic acids having an ethylenic double bond to effect alkali-solubility such as acrylic acid, methacrylic acid, malic acid, fumaric acid and the like, known monomers used in the preparation of an acrylic resin and others.

The above-mentioned acrylic acid derivative is exemplified, for example, by the acrylic acid esters protected for the hydroxyl groups of the carboxyl group by a dry etching resistance improving group or non-acid-dissociable substituent group such as 1-adamantyl acrylate, 2-adamantyl acrylate, cyclohexyl acrylate, naphthyl acrylate, benzyl acrylate, 3-oxocyclohexyl acrylate, bicyclo[2.2.1]heptyl acrylate, tricyclodecanyl acrylate, ester of acrylic acid and terpineol, ester of acrylic acid and 3-bromoacetone and the like, and others. The methacrylic acid derivative is exemplified by the derivatives of methacrylic acid corresponding to these acrylic acid derivatives.

The carboxylic acid having an ethylenic double bond is exemplified, for example, by acrylic acid, methacrylic acid, malic acid, fumaric acid and the like.

Examples of the known monomers used in the preparation of an acrylic resin include, for example, alkyl esters of acrylic acid such as methyl acrylate, ethyl acrylate, propyl acrylate, isopropyl acrylate, n-butyl acrylate, isobutyl acrylate, n-hexyl acrylate, octyl acrylate, 2-ethylhexyl acrylate, dodecyl acrylate, 2-hydroxyethyl acrylate, 2-hydroxypropyl acrylate and the like as well as corresponding alkyl esters of methacrylic acid and others.

The resinous ingredient (A) can be easily prepared by known radical polymerization of the corresponding acrylic acid ester monomers using a radical polymerization initiator such as azobisisobutyronitrile (AIBN).

As the acid-generating agent of the component (B) generating an acid by light exposure in the inventive composition, on the other hand, any one can be used by adequately selecting from those heretofore known as the acid-generating agent in chemical-amplification resists. Examples of this acid-generating agent include onium salts such as diphenyliodonium trifluoromethanesulfonate, (4-methoxyphenyl)phenyliodonium trifluoromethanesulfonate, bis(4-tert-butylphenyl)iodonium trifluoromethanesulfonate, triphenylsulfonium trifluoromethanesulfonate, (4-methoxyphenyl) diphenylsulfonium trifluoromethanesulfonate, (4-tert-butylphenyl)diphenylsulfonium trifluoromethanesulfonate, diphenyliodonium nonafluorobutanesulfonate, bis(4-tert-butylphenyl)iodonium nonafluorobutanesulfonate, triphenylsulfonium nonafluorobutanesulfonate and the like, of which, inter alia, those onium salts having a fluorinated alkyl sulfonic acid ion as the anion are preferable.

These acid-generating agents (B) can be used singly or can be used as a combination of two kinds or more. The compounding amount thereof is selected in the range from 0.5 to 30 parts by mass or, preferably, from 1 to 10 parts by mass per 100 parts by mass of the resinous ingredient (A). When this compounding amount is smaller than 0.5 part by mass, pattern formation cannot be fully accomplished while, when in excess over 30 parts by mass, a difficulty is encountered in obtaining a uniform solution resulting in a decrease in the storage stability.

The composition of the present invention is used as a solution by dissolving the above-described resinous ingredient (A) and the acid-generating agent as the component (B) in an organic solvent (C). As the organic solvent to be used here, any ones can be used by adequately selecting one kind or two kinds or more as desired from those known as the solvent in the prior art chemical-amplification resists provided that a uniform solution can be obtained by dissolving the above-described two components.

Examples of such an organic solvent (C) include ketones such as acetone, methyl ethyl ketone, cyclohexanone, methyl isoamyl ketone, 2-heptanone and the like, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl ether, monoethyl ether, monopropyl ether, monobutyl ether and monophenyl ether thereof, cyclic ethers such as dioxane and esters such as methyl lactate, ethyl lactate, methyl acetate, ethyl acetate, butyl acetate, methyl pyruvate, ethyl pyruvate, methyl methoxypropionate, ethyl ethoxypropionate and the like.

It is particularly advantageous in the composition of the present invention to use a mixed solvent of propyleneglycol monomethyl ether acetate and/or ethyl lactate and γ-butyrolactone as this organic solvent. The mixing proportion in this case is selected such that the mass proportion of the former and the latter is in the range from 70:30 to 95:5.

It is optional in the composition of the present invention, in order to accomplish improvements in the resist pattern profile, holding stability and others that, according to need, a secondary lower aliphatic amine or tertiary lower aliphatic amine is contained. Examples of this secondary or tertiary amine include trimethylamine, diethylamide, trimethylamine, di-n-propylamine, tri-n-propylamine, tripentylamine, diethanolamine, triethanolamine and the like. They can be used singly or can be used as a combination of two kinds or more. These amines are used usually in the range from 0.01 to 0.2% by mass relative to the resinous ingredient (A).

It is further optional according to desire that the composition of the present invention is admixed with and contains additives having miscibility such as, for example, auxiliary resins to improve resist film properties, surface active agents to improve coating workability, dissolution-reducing agents, plasticizers, stabilizers, coloring agents, halation inhibitors and others.

As the method for using the inventive composition, any resist pattern-forming method in the conventional photoresist technology can be used but, in order to conduct satisfactorily, a substrate such as a silicon wafer is first coated on a spinner and the like with a solution of the resist composition and dried to form a photosensitive layer which is irradiated, for example, with ArF excimer laser beams on an ArF light-exposure machine through a desired mask pattern and heated. Nextly, the same is subjected to a development treatment with an alkaline developer solution such as, for example, a 0.1–10% by mass aqueous solution of tetramethylammonium hydroxide. In this manner, a pattern can be obtained with fidelity to the mask pattern.

While the inventive composition is useful for ArF excimer laser beams, it is also effective for radiations having a still shorter wavelength such as $F_2$ lasers, EUV (extreme ultraviolet light) VUV (vacuum ultraviolet light), electron beams, X-rays, soft X-rays and the like.

The inventive composition, which is of the chemical-amplification type, has high transparency to an active light of 200 nm or shorter wavelength or, in particular, ArF excimer laser beams and is capable of giving a resist pattern having, along with high pattern resolution, good resist pattern profile and improved line edge roughness and exhibiting excellent dry etching resistance and adhesion to the substrate. Accordingly, it can be used satisfactorily in the manufacture of semiconductor devices necessitating ultrafine working as a positive-working resist of the chemical-amplification type using ArF excimer laser beams as the light source.

In the following, the present invention is described in more detail by way of examples. The line edge roughness values and the dry etching resistance in the examples were measured by the following methods.

(1) Line edge roughness value: By using a measuring SEM (manufactured by Hitachi Ltd., Model S-9220), the line width of the resist pattern as the sample were measured at 32 points and calculation was made from the results for the triple value ($3\sigma$) of the standard deviation ($\sigma$). A smaller value of this $3\sigma$ meant that a resist patter of uniform width with smaller roughness could be obtained.

(2) Dry etching resistance: Evaluation was made by measuring the film thickness reduction when treatment is conducted by using a gaseous mixture of tetrafluoromethane ($CF_4$), trifluoromethane ($CHF_3$) and helium (flow rate ratio 30:30:100) as the etching gas in an etching apparatus (manufactured by Tokyo Ohka Kogyo Co., Model OAPM-2400).

EXAMPLE 1

A solution of a positive-working resist composition was prepared by dissolving, in 800 parts by mass of propyleneglycol monomethyl ether, 100 parts by mass of a copolymer [component (A)] having a mass-average molecular weight of 10000 and consisting of (i) 60% by moles of the monomer units expressed by the formula:

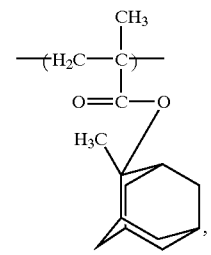

(ii) 30% by moles of the monomer units expressed by the formula:

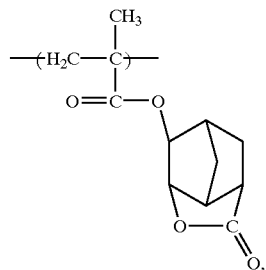

and (iii) 10% by moles of the monomer units expressed by the formula:

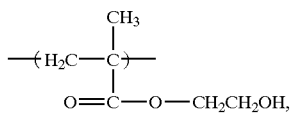

0.2 part by mass of triphenylsulfonium trifluorometanesulfonate [component (B)], 2.0 parts by mass of triphenylsulfonium nonafluorobutanesulfonate and 0.2 part by mass of triethanolamine.

This resist solution was applied by using a spinner onto a silicon wafer provided with an organic antireflection film of 82 nm film thickness (AR-19, a product of Shipley Co., was used) and dried on a hot plate at 140° C. (pre-baking) for 90 seconds to form a resist layer of 360 nm film thickness. Nextly, patternwise irradiation was performed with ArF excimer laser beams (193 nm) on an ArF light-exposure machine (manufactured by Nikon Co., Model NSR-S302A, NA=0.6) followed by a heat treatment (PEB) at 130° C. for 90 seconds and then puddle development for 30 seconds with a 2.38% by mass aqueous solution of tetramethylammonium hydroxide followed by washing with water for 30 seconds and drying.

The resist pattern formed in this procedure had such a critical pattern resolution that a line-and-space pattern of 120 nm could be formed in 1:1. The exposure time (sensitivity) there as measured in the unit of mJ/cm$^2$ (energy density) was 17.0 mJ/cm$^2$ and the aforementioned 120 nm line-and-space pattern had excellently orthogonal pattern profile so that a good resist pattern could be obtained.

No film falling was noted in this resist pattern to indicate good adhesion. A 130 nm line-and-space pattern had a focusing depth latitude of 0.6 μm. The film thickness reduction as determined was 144 nm and the line edge roughness value was 8.5.

EXAMPLE 2

A positive-working resist composition was prepared in the same manner as in Example 1 excepting for the replacement of the copolymer as the component (A) in Example 1 with a copolymer having a mass-average molecular weight of 10000 and consisting of (iv) 65% by moles of the monomer units expressed by the formula:

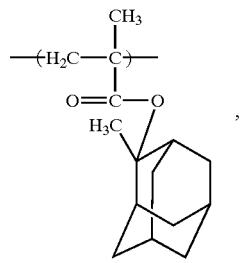

(v) 25% by moles of the monomer units expressed by the formula

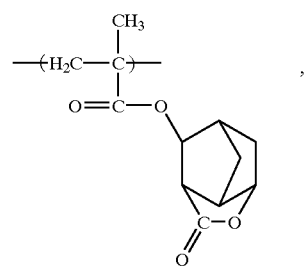

and (vi) 10% by moles of the monomer units expressed by the formula:

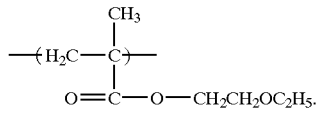

Nextly, this resist solution was used to form a resist pattern in the same manner as in Example 1.

As to the resist pattern obtained in this way, like Example 1, the 120 nm line-and-space pattern was formed to have good cross sectional profile with excellent orthogonality and the sensitivity was 16 mJ/cm$^2$, film falling was not noted and good adhesion was exhibited. The 130 nm line-and-space pattern had a focusing depth latitude of 0.6 μm, film thickness reduction of 148 nm and line edge roughness value of 7.1.

COMPARATIVE EXAMPLE 1

A solution of a positive-working resist composition was prepared in the same manner as in Example 1 excepting for the replacement of the copolymer as the component (A) in Example 1 with a copolymer having a mass-average molecular weight of 14000 and consisting of 60% by moles of the monomer units expressed by the formula:

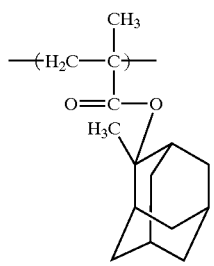

and 40% by moles of the monomer units expressed by the formula:

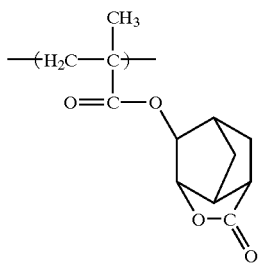

Nextly, by using this resist solution, a resist pattern was formed in the same manner as in Example 1.

As to the resist pattern obtained in this way, a 130 nm line-and-space patter was formed with a T-wise cross sectional profile and the sensitivity was 18 mJ/cm². Film falling was not noted and adhesion was found good. The 130 nm line-and-space pattern had a focusing depth latitude of 0.4 µm, film thickness reduction of 139 nm and line edge roughness value of 18.2.

COMPARATIVE EXAMPLE 2

A positive-working resist composition was prepared in the same manner as in Example 1 by using, as the component (A), a copolymer having a mass-average molecular weight of 10000 and consisting of 60% by moles of the monomer units (i) in Example 1, 30% by moles of the monomer units (ii) and 10% by moles of methacrylic acid units and a resist pattern was formed by using the same.

As to the resist pattern obtained in this way, a 120 nm line-and-space pattern was formed with an orthogonal cross sectional profile and the sensitivity was 21 mJ/cm². Film falling was not noted and adhesion was found good. The 130 nm line-and-space pattern had a focusing depth latitude of 0.6 µm, film thickness reduction of 140 nm and line edge roughness value of 10.6.

COMPARATIVE EXAMPLE 3

A positive-working resist composition was prepared in the same manner as in Comparative Example 2 by using, as the component (A), a copolymer having a mass-average molecular weight of 10000, of which the methacrylic acid units of the component (A) in Comparative Example 2 were replaced with ethyl methacrylate units, and a resist pattern was formed by using the same.

As to the resist pattern obtained in this way, a 120 nm line-and-space pattern was formed with an orthogonal cross sectional profile and the sensitivity was 18 mJ/cm². Film falling was not noted and adhesion was found good. The 130 nm line-and-space pattern had a focusing depth latitude of 0.6 µm, film thickness reduction of 142 nm and line edge roughness value of 10.0.

What is claimed is:

1. A chemical-amplification positive-working photoresist composition which comprises, as a uniform solution in an organic solvent:
   (A) a resinous compound capable of being imparted with increased solubility in an aqueous alkaline solution by interacting with an acid;
   (B) an acid-generating compound capable of generating an acid by irradiation with a radiation; and
   (C) an organic solvent, wherein the resinous compound as the component (A) is a copolymer consisting of the monomeric units to constitute the main chain structure thereof comprising (a1) acrylic or methacrylic acid ester units having a solubility-reducing group, (a2) monomeric units of an ester compound between acrylic or methacrylic acid and a lactone ring-containing bridged polycyclic saturated alcohol and (a3) monomeric units of an ester compound between acrylic or methacrylic acid and a straight-chain alcohol substituted by a hydroxyl group, alkoxy group or acyl group.

2. The chemical-amplification positive-working photoresist composition according to claim 1, wherein the resinous compound as the component (A) is a copolymer comprising (a1) acrylic or methacrylic acid ester units having a solubility-reducing group, (a2) monomeric units represented by the general formula:

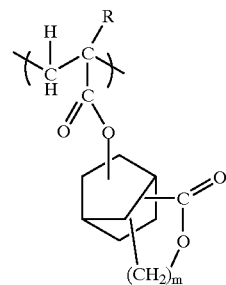

in which R is a hydrogen atom or a methyl group and m is 0 or 1, and (a3) monomeric units represented by the general formula:

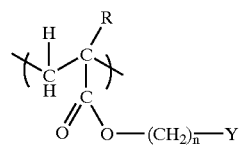

in which R has the same meaning as defined above, Y is a hydroxyl group, an alkoxy group or an acyl group, and n is an integer of 2 to 18.

3. The chemical-amplification positive-working photoresist composition according to claim 2, wherein (a1) the acrylic or methacrylic acid ester unit having a solubility-reducing group in the resinous compound as the component (A) is a unit represented by the general formula:

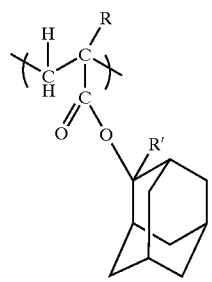

in which R is a hydrogen atom or a methyl group and R' is an alkyl group having 1 to 4 carbon atoms.

4. The chemical-amplification positive-working photoresist composition according to claim 1, wherein the resinous compound as the component (A) is a copolymer consisting of from 40 to 80% by moles of the monomeric units (a1), from 10 to 40% by moles of the monomeric units (a2) and from 5 to 20% by moles of the monomeric units (a3).

5. The chemical-amplification positive-working photoresist composition according to claim 2, wherein the monomeric unit (a2) is a unit represented by the general formula:

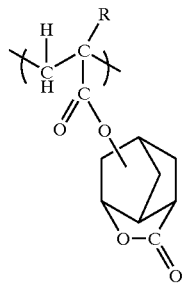

in which R is a hydrogen atom or a methyl group.

6. The chemical-amplification positive-working photoresist composition according to claim 5, wherein the monomeric unit (a2) is a unit expressed by the formula:

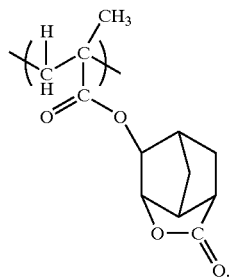

7. The chemical-amplification positive-working photoresist composition according to claim 2, wherein the monomeric unit (a2) in the resinous compound as the component (A) is a unit represented by the general formula:

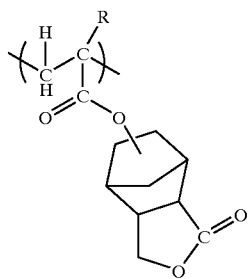

in which R is a hydrogen atom or a methyl group.

8. The chemical-amplification positive-working photoresist composition according to claim 1, wherein the acid-generating compound as the component (B) is an onium salt compound of which the anionic counterpart is a fluorinated alkylsulfonic acid ion.

9. The chemical-amplification positive-working photoresist composition according to claim 1, which further comprises from 0.01 to 0.2 part by weight of a secondary aliphatic amine compound or a tertiary aliphatic amine compound per 100 parts by weight of the resinous compound as the component (A).

10. The chemical-amplification positive-working photoresist composition according to claim 1, wherein the organic solvent is a solvent mixture consisting of propyleneglycol monomethyl ether acetate, ethyl lactate or a combination thereof and γ-butyrolactone.

* * * * *